US011448964B2

(12) United States Patent
Lee et al.

(10) Patent No.: US 11,448,964 B2
(45) Date of Patent: Sep. 20, 2022

(54) COATING COMPOSITIONS FOR USE WITH AN OVERCOATED PHOTORESIST

(71) Applicant: Rohm and Haas Electronic Materials Korea Ltd., Chungcheongnam-Do (KR)

(72) Inventors: Jung-June Lee, Chungcheongnam-Do (KR); Jae-Bong Lim, Chungcheongnam-Do (KR); Jun-Han Yun, Chungcheongnam-Do (KR); Ji-Hoon Kang, Chungcheongnam-Do (KR)

(73) Assignee: ROHM AND HAAS ELECTRONIC MATERIALS KOREA LTD., Chungcheongnam-Do (KR)

(*) Notice: Subject to any disclaimer, the term of this patent is extended or adjusted under 35 U.S.C. 154(b) by 0 days.

(21) Appl. No.: 15/162,445

(22) Filed: May 23, 2016

(65) Prior Publication Data

US 2017/0336709 A1    Nov. 23, 2017

(51) Int. Cl.
| | | |
|---|---|---|
| G03F 7/09 | (2006.01) |
| G03F 7/038 | (2006.01) |
| G03F 7/039 | (2006.01) |
| G03F 7/30 | (2006.01) |
| G03F 7/26 | (2006.01) |

(52) U.S. Cl.
CPC ............ G03F 7/091 (2013.01); G03F 7/0382 (2013.01); G03F 7/0397 (2013.01); G03F 7/26 (2013.01); G03F 7/30 (2013.01)

(58) Field of Classification Search
CPC .......... G03F 7/0382; G03F 7/09; G03F 7/091; G03F 7/092; G03F 7/11; G03F 7/26
USPC ................ 430/270.1, 271.1, 273.1, 510, 512
See application file for complete search history.

(56) References Cited

U.S. PATENT DOCUMENTS

| | | | |
|---|---|---|---|
| 4,368,247 A * | 1/1983 | Fletcher, Jr. ......... | C07D 471/04 430/17 |
| 5,128,232 A | 7/1992 | Thackeray et al. | |
| 5,658,706 A * | 8/1997 | Niki ........................ | G03F 7/039 430/270.1 |
| 5,744,281 A * | 4/1998 | Niki ........................ | G03F 7/039 430/270.1 |
| 6,261,743 B1 | 7/2001 | Pavelchek et al. | |
| 6,767,689 B2 | 7/2004 | Pavelchek et al. | |
| 6,852,421 B2 | 2/2005 | Wayton et al. | |
| 6,887,648 B2 | 5/2005 | Pavelchek et al. | |
| 7,163,751 B2 | 1/2007 | Wayton et al. | |
| 7,968,268 B2 | 6/2011 | Wang | |
| 8,298,747 B2 * | 10/2012 | Minegishi ............... | C08L 79/04 430/270.1 |
| 8,501,383 B2 | 8/2013 | Zampini et al. | |
| 8,623,589 B2 | 1/2014 | Kudo et al. | |
| 8,968,989 B2 * | 3/2015 | Ouattara ................. | G03F 7/092 430/322 |
| 8,993,215 B2 * | 3/2015 | Nishimaki ............. | G03F 7/091 430/270.1 |
| 2002/0107318 A1 * | 8/2002 | Yamada .................. | C04B 26/10 524/495 |
| 2006/0290429 A1 * | 12/2006 | Kishioka ................. | G03F 7/038 430/270.1 |
| 2009/0053647 A1 * | 2/2009 | Enomoto .................. | G03F 7/11 430/271.1 |
| 2010/0092879 A1 | 4/2010 | Minegishi et al. | |
| 2011/0033801 A1 | 2/2011 | Zampini et al. | |
| 2011/0294069 A1 | 12/2011 | Bae et al. | |
| 2015/0212414 A1 | 7/2015 | Pohlers et al. | |

FOREIGN PATENT DOCUMENTS

| | | |
|---|---|---|
| EP | 0164248 A2 | 12/1985 |
| EP | 0783136 A2 | 7/1997 |
| EP | 0829766 A2 | 3/1998 |
| KR | 2009-0129403 A | 12/2009 |
| KR | 2014-0070472 A | 6/2014 |
| TW | 201500858 A | 1/2015 |
| WO | 2014129582 A1 | 8/2014 |

OTHER PUBLICATIONS

English language suimmary of Office Action dated Mar. 19, 2018 issued in Japanese counterpart application 2017-094089.
English language summary of Office Action dated Dec. 26, 2017 issued in Taiwan counterpart application 106-2(6) 01182-10621330130.
English language summary of Office Action issued in Korean counterpart application 10-2017-0058512.

* cited by examiner

*Primary Examiner* — John S Chu
(74) *Attorney, Agent, or Firm* — Cantor Colburn LLP

(57) ABSTRACT

Organic coating compositions, particularly antireflective coating compositions for use with an overcoated photoresist, are provided that comprise that comprise a thermal acid generator that comprises: i) a pyridinium component having one or more ring substituents selected from optionally substituted alkyl and optionally substituted heteroalkyl; and ii) a sulfonic acid component.

17 Claims, No Drawings

COATING COMPOSITIONS FOR USE WITH AN OVERCOATED PHOTORESIST

BACKGROUND

The present invention relates to compositions and, in particular, antireflective coating compositions for use in microelectronic application. Compositions of the invention comprise a thermal acid generator that comprises: i) a pyridinium component having one or more ring substituents selected from optionally substituted alkyl and optionally substituted heteroalkyl; and ii) a sulfonic acid component. Preferred compositions of the invention are used with an overcoated photoresist composition and may be referred to a bottom antireflective compositions or "BARCs".

Photoresists are photosensitive films used for the transfer of images to a substrate. A coating layer of a photoresist is formed on a substrate and the photoresist layer is then exposed through a photomask to a source of activating radiation. Following exposure, the photoresist is developed to provide a relief image that permits selective processing of a substrate.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See U.S. Pat. Nos. 8,623,589, 6,767,689 and 6,887,648; and US 2015/0212414. For many high performance lithographic applications, particular antireflective compositions are utilized in order to provide the desired performance properties, such as optimal absorption properties and coating characteristics. Nevertheless, electronic device manufacturers continually seek increased resolution of a photoresist image patterned over antireflective coating layers and in turn demand ever-increasing performance from an antireflective composition.

It thus would be desirable to have new antireflective compositions for use with an overcoated photoresist. It would be particularly desirable to have new antireflective compositions that exhibit enhanced performance and could provide increased resolution of an image patterned into an overcoated photoresist.

SUMMARY

We now provide new coating compositions that can be used with overcoated photoresist compositions. In preferred aspects, coating compositions of the invention can function as an effective antireflective layer for an overcoated resist layer.

In particular aspects, coating compositions are provided, including compositions that can be utilized as an antireflective coating layer for an overcoated photoresist, that comprise: 1) a resin; and 2) an ionic thermal acid generator that comprises: i) a pyridinium component having one or more ring substituents selected from optionally substituted alkyl and optionally substituted heteroalkyl; and ii) a sulfonic acid component. In certain aspects, the sulfonic acid component does not contain fluoro or other halogen substitution. In certain aspects, the pyridinium component does not contain fluoro or other halogen substitution.

We have found that the present thermal acid generators can exhibit significant solubility in organic solvents used to formulate antireflective coating compositions, such as 2-hydroxyisobutyric acid methyl ester (HBM), propylene glycol methyl ether (PGME) and ethyl lactate (EL).

We have further found that coating compositions of the invention can produce reduced defects during lithographic processing in conjunction with an overcoated photoresist composition.

In certain preferred aspects, the ring nitrogen of the pyridinium component is not substituted. In additional preferred aspects, the pyridinium component comprises one or more ring substituents selected from 1) $C_{1-20}$alkyl or $C_{1-12}$alkyl or $C_{1-6}$alkyl and/or 2) $C_{1-20}$alkoxy or $C_{1-12}$alkoxy or $C_{1-6}$alkoxy.

A variety of sulfonic acid components may be utilized. In certain preferred aspects, the sulfonic acid component is an optionally substituted aryl sulfonic acid.

As mentioned, preferred underlying coating compositions of the invention are formulated with a solvent component that comprises one or more of 2-hydroxyisobutyric acid methyl ester, propylene glycol methyl ether and ethyl lactate. Particularly preferred coating compositions of the composition will be formulated with a solvent component (total solvent of the composition) that is at least 10, 20, 30, 40, 50, 60, 70, 80, 90, 95 or more percent by weight composed of one of more of 2-hydroxyisobutyric acid methyl ester, propylene glycol methyl ether and ethyl lactate.

For antireflective applications, underlying compositions of the invention also preferably contain a component that comprises chromophore groups that can absorb undesired radiation used to expose the overcoated resist layer from reflecting back into the resist layer. The resin or crosslinker may comprise such chromophore groups, or a coating composition may comprise a further component that comprises suitable chromophore groups.

In use with an overcoated photoresist, a coating composition may be applied on a substrate such as a semiconductor wafer which may have one or more organic or inorganic coating layers thereon. The applied coating layer may be optionally thermally treated prior to overcoating with a photoresist layer. Such thermal treatment may cause hardening including crosslinking of the coating composition layer. Such crosslinking may include hardening and/or covalent-bonding forming reactions between one or more composition components and can modulate water contact angle of the coating composition layer.

Thereafter, a photoresist composition may be applied over the coating composition layer followed by imaging of the applied photoresist composition layer with patterned activating radiation and the imaged photoresist composition layer is developed to provide a photoresist relief image.

A variety of photoresists may be used in combination (i.e. overcoated) with a coating composition of the invention. Preferred photoresists for use with the underlying coating compositions of the invention are chemically-amplified resists, especially negative-tone photoresists that contain one or more photoactive compounds and a resin component that contains units that undergo a deblocking or cleavage reaction in the presence of photogenerated acid.

In preferred aspects, the photoresist composition is designed for a negative-tone resist where the light-exposed regions remains after development process, but positive tone development can be also employed to remove the exposed portions of the photoresist layer.

The invention further provides methods for forming a photoresist relief image and novel articles of manufacture comprising substrates (such as a microelectronic wafer substrate) coated with a coating composition of the invention alone or in combination with a photoresist composition. Acid generators are also provided.

Other aspects of the invention are disclosed infra.

DETAILED DESCRIPTION

As discussed above, organic coating compositions, particularly antireflective compositions for use with an overcoated photoresist, are provided that comprise an acid generator component that can exhibit significant solubility in organic casting solvents, including 2-hydroxyisobutyric acid methyl ester (HBM), propylene glycol methyl ether (PGME) and ethyl lactate (EL). We have further found that coating compositions of the invention can produce reduced defects during lithographic processing conjunction with an overcoated photoresist composition.

In one aspect, preferred acid generators include those of the following Formula (I):

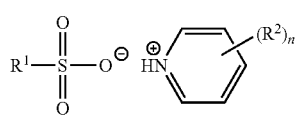

(I)

wherein $R^1$ is a non-hydrogen substituent such as optionally substituted alkyl, optionally substituted heteroalkyl, optionally substituted optionally substituted carbocyclic or optionally substituted heteroaryl;

each $R^2$ is independently a non-hydrogen substituent such as hydroxyl, cyano, halogen (F, Cl, Br or I), amino, optionally substituted alkyl, optionally substituted heteroalkyl, optionally substituted optionally substituted carbocyclic or optionally substituted heteroaryl;

and n is 0 (no $R^2$ groups present, pyridyl ring not substituted), 1, 2, 3, 4 or 5, and more typically n is 0, 1, 2, 3 or 4, and preferably n is at least 1.

In certain aspects, $R^1$ does not contain fluoro or other halogen substitution.

In certain aspects, an acid generator of Formula (I) will not have any fluoro atom ring substituents on the pyridyl ring. In additional aspects, an acid generator of formula (I) will not have any fluoro-containing (including fluoroalkyl) ring substituents on the pyridyl ring. In yet further aspects, an acid generator of Formula (I) will not have any halogen atom ring substituents on the pyridyl ring. In yet additional aspects, an acid generator of formula (I) will not have any halogen-containing (including fluoroalkyl) ring substituents on the pyridyl ring.

Preferred $R^2$ groups of Formula I include $C_{1-6}$alkyl and $C_{1-4}$alkyl including methyl, ethyl, n-propyl-sec-propyl, iso-propyl, n-butyl, sec-burtyl and tert-butyl; and $C_{1-6}$alkoxy and $C_{1-4}$ alkoxy including methoxy, ethoxy, propoxy and butoxy.

Specifically preferred cation components of thermal acid generators of Formula (I) include the following:

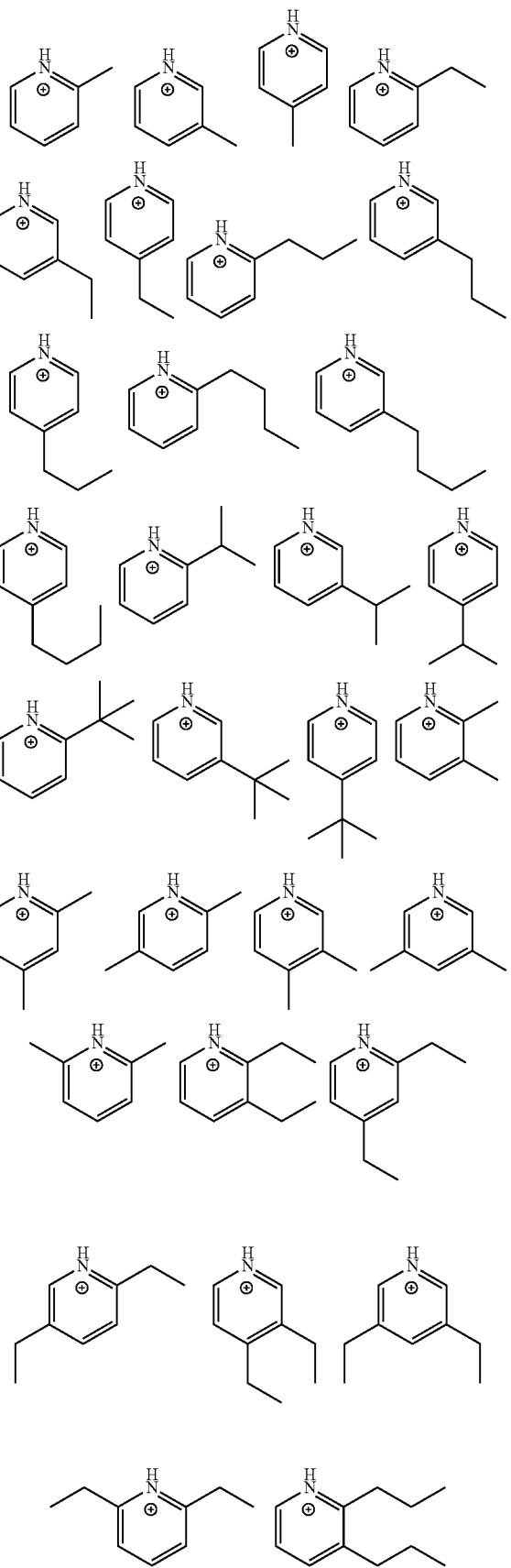

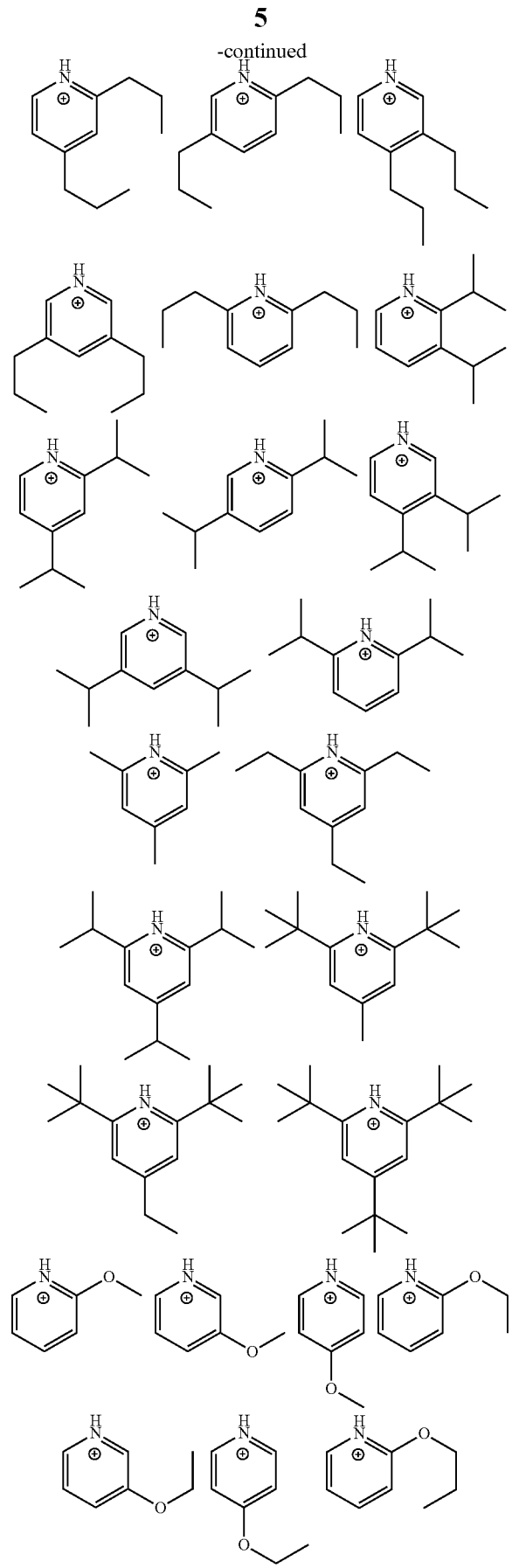

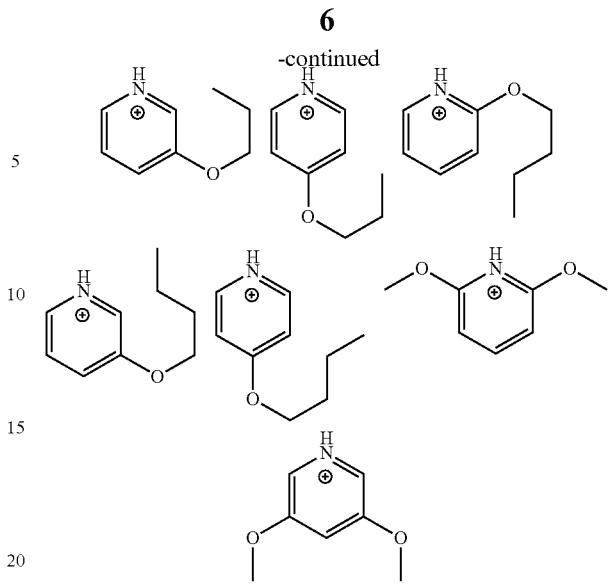

As referred to herein, suitable heteroalkyl include optionally substituted $C_{1-20}$alkoxy, optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; and optionally substituted alkylamine preferably having 1 to about 20 carbon atoms.

As referred to herein, the term "carbon alicyclic group" means each ring member of the non-aromatic group is carbon. The carbon alicyclic group can have one or more endocyclic carbon-carbon double bonds, provided the ring is not aromatic. The term optionally substituted "cycloalkyl group" means each ring member of the non-aromatic group is carbon and the carbon ring does not have any endocyclic carbon-carbon double bonds. For instance, cyclohexyl, cyclopentyl and adamantyl are cycloalkyl groups as well as carbon alicyclic groups. Carbon alicyclic groups and cycloalkyl groups may comprise one ring or multiple (e.g. 2, 3, 4 or more) bridged, fused or otherwise covalently linked rings.

As referred to herein, a "heteroaryl" group includes an aromatic 5-8 membered monocyclic, 8-12 membered bicyclic, or 11-14 membered tricyclic ring system having 1-3 heteroatoms if monocyclic, 1-6 heteroatoms if bicyclic, or 1-9 heteroatoms if tricyclic, said heteroatoms selected from O, N, or S (e.g., carbon atoms and 1-3, 1-6, or 1-9 heteroatoms of N, O, or S if monocyclic, bicyclic, or tricyclic, respectively), wherein 0, 1, 2, 3, or 4 atoms of each ring may be substituted by a substituent. Examples of heteroaryl groups include pyridyl, furyl or furanyl, imidazolyl, benzimidazolyl, pyrimidinyl, thiophenyl or thienyl, quinolinyl, indolyl, thiazolyl, and the like.

Various materials and substituents (including groups A, B, X and Y of Formula (I) above) that are "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

In generally preferred aspects, the resin and thermal acid generator components of a coating composition prior to thermal treatment are distinct and separate materials, i.e. the resin component and acid generator are not covalently linked. In certain other embodiments, the acid generator can be linked to the resin component, for example covalently tethered as a pendant group.

A variety of resins may serve as the resin components of an underlying coating composition.

Particularly preferred resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Preferred polyester resins for use in an antireflective composition of the invention are also disclosed in U.S. Pat. No. 8,501,383; U.S. 2011/0033801; and U.S. Pat. No. 7,163,751. As disclosed in those patent documents, resins that contain ester repeat units (polyester) may be suitably provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. In certain aspects, preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

Resins of coating compositions of the invention may comprise a variety of additional groups such as cyanurate groups, as disclosed in U.S. Pat. Nos. 6,852,421 and 8,501,383.

Particularly preferred matrix resins of coating compositions of the invention may comprise one or more one or more cyanurate groups and polyester linkages.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in a coating composition employed with a photoresist imaged at sub-200 nm wavelengths such as 193 nm. An isocyanurate compound also may be polymerzied with one or more polyols to provide a resin useful in the present underlying coating compositions. Resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating compositions that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contains phenyl, anthracene, naphthyl, etc. units. It is often preferred, however, that the one or more resins that provide water contact angle modulation also contain chromophore moieties.

Preferably resins of underlying coating compositions of the invention will have a weight average molecular weight (Mw) of about 1,000 to about 10,000,000 daltons, more typically about 2,000 to about 100,000 daltons, and a number average molecular weight (Mn) of about 500 to about 1,000,000 daltons. Molecular weights (either Mw or Mn) of the resins of compositions of the invention are suitably determined by gel permeation chromatography.

The resin component will be the major solids component of an underlying coating composition in many preferred embodiments. For instance, the resin suitably may be present from 50 to 99.9 weight percent based on total solid content of a coating composition, more typically from 80 to 95 weight percent based total solid content of a coating composition. As referred to herein, solids of a coating composition refer to all materials of the coating composition except solvent carrier.

In certain embodiments, a coating composition of the invention may comprise a crosslinker component. For example, coating compositions may include amine-based crosslinkers such as melamine materials, including melamine resins such as manufactured by Cytec Industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of a coating composition of the invention in general is present in an amount of between about 5 and 50 weight percent of total solids (all components except solvent carrier) of the coating composition, more typically in an amount of about 5 to 25 weight percent total solids.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. As discussed, preferred coating composition will contain a solvent component that includes 2-hydroxyisobutyric acid methyl ester, propylene glycol methyl ether and ethyl lactate. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Exemplary Photoresist Systems

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (V), a lactone-containing monomer of the following formula (VI), a base-soluble monomer of the following formula (VII) for adjusting dissolution rate in alkaline developer, and an acid-generating monomer of the following formula (VIII), or a combination comprising at least one of the foregoing monomers:

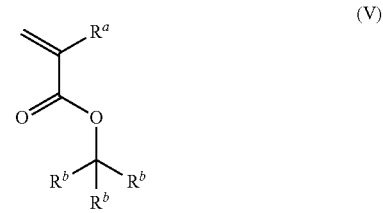

(V)

(VI)

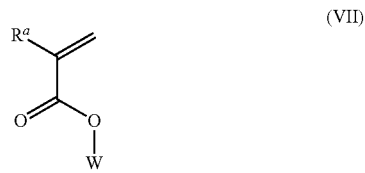

(VII)

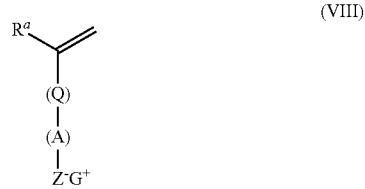

(VIII)

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the acid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

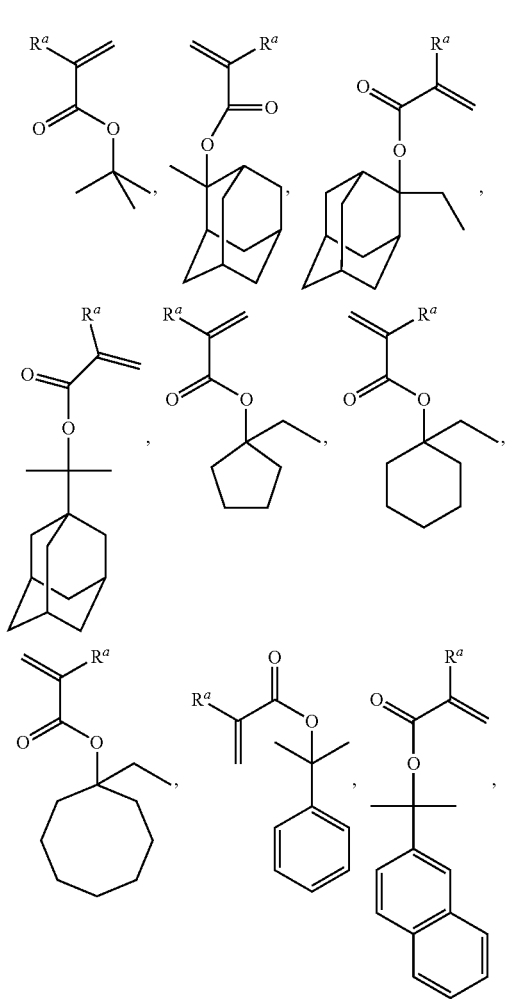

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

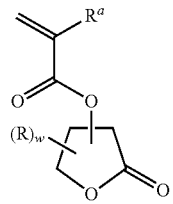

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

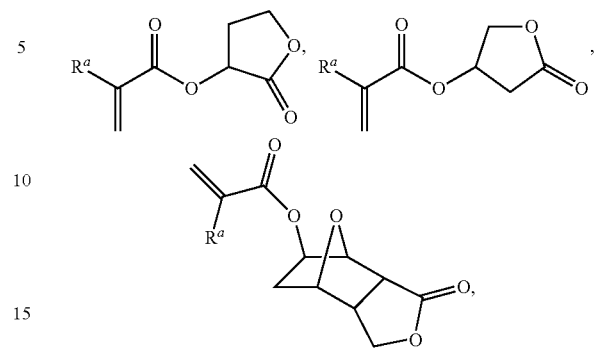

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

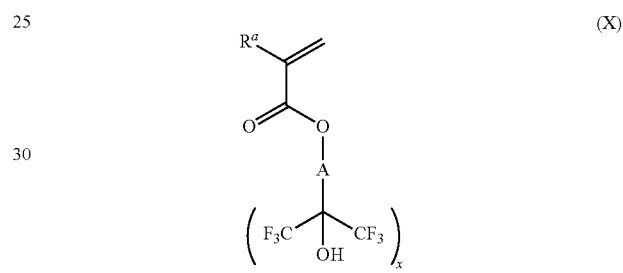

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

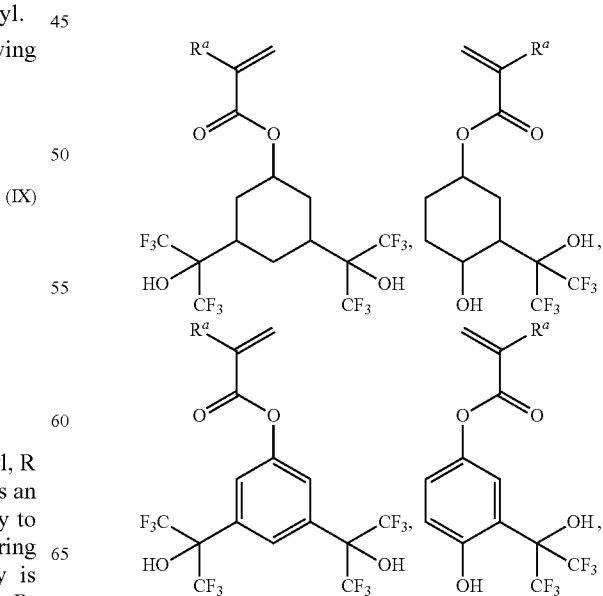

-continued

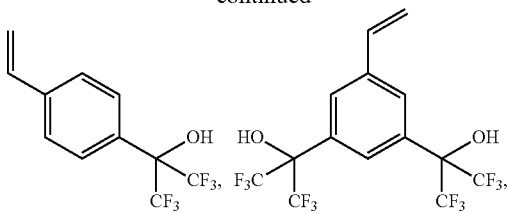

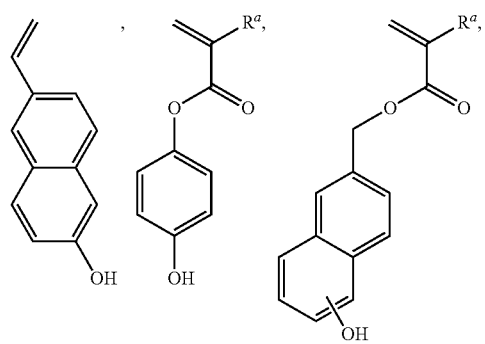

or a combination comprising at least one of the foregoing, wherein $R^a$ is H, F, —CN, $C_{1-6}$ alkyl, or $C_{1-6}$ fluoroalkyl.

Preferred acid generating monomers include those of the formulae (XI) or (XII):

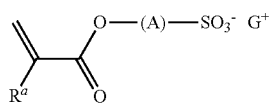 (XI)

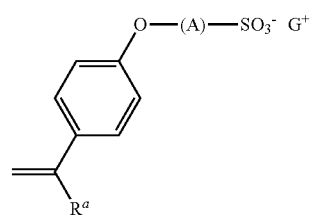 (XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C($R^1$)$_2$)$_x$C(=O)O]$_b$—C(($R^2$)$_2$)$_y$(CF$_2$)$_z$— group, or an o-, m- or p-substituted —C$_6$F$_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred acid generating monomers include:

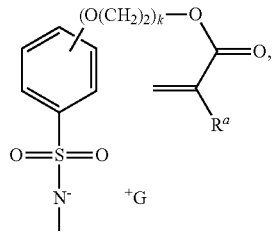

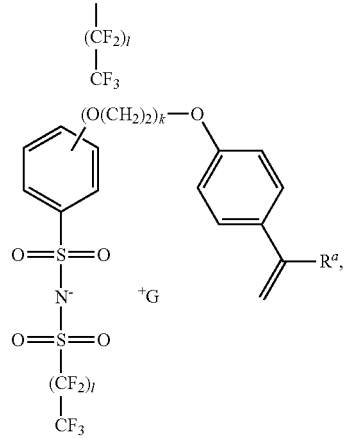

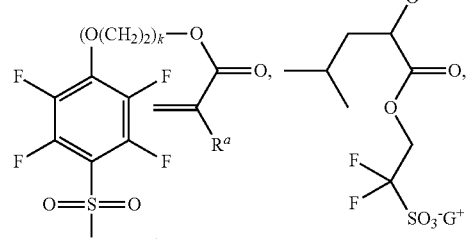

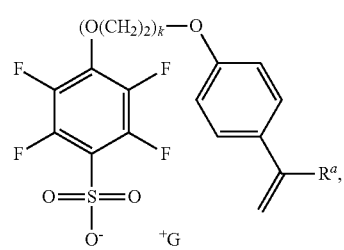

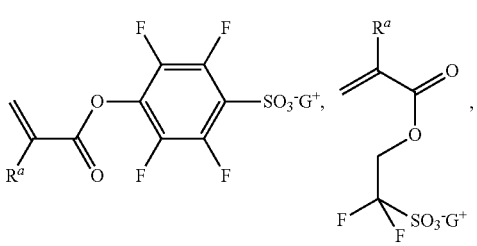

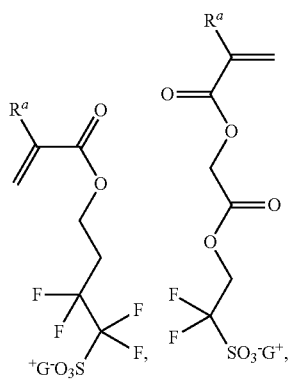

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation. $G^+$ as referred to herein throughout the various formulae may be an acid generator as disclosed herein and comprise an oxo-dioxolane moiety and/or an oxo-dioxane moiety.

Preferred acid-generating monomers may include sulfonium or iodonium cation. Preferably, in formula (IV), $G^+$ is of the formula (XIII):

$$\overset{\oplus}{X}\text{---}(R^0)_a \quad \text{(XIII)}$$

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

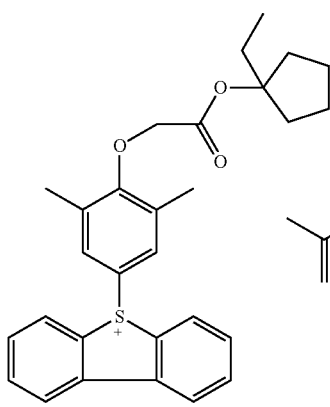

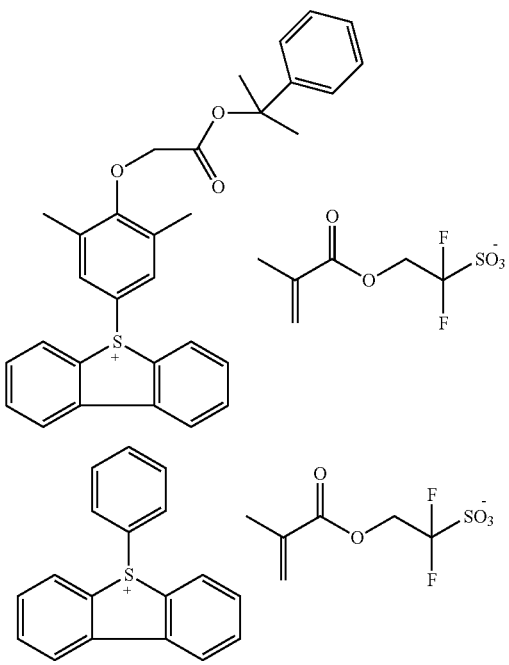

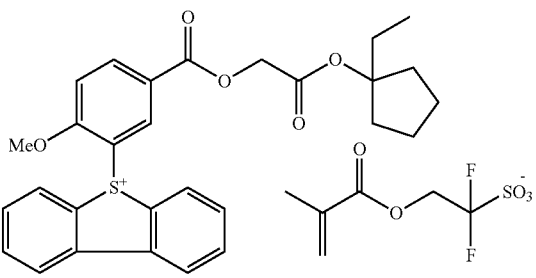

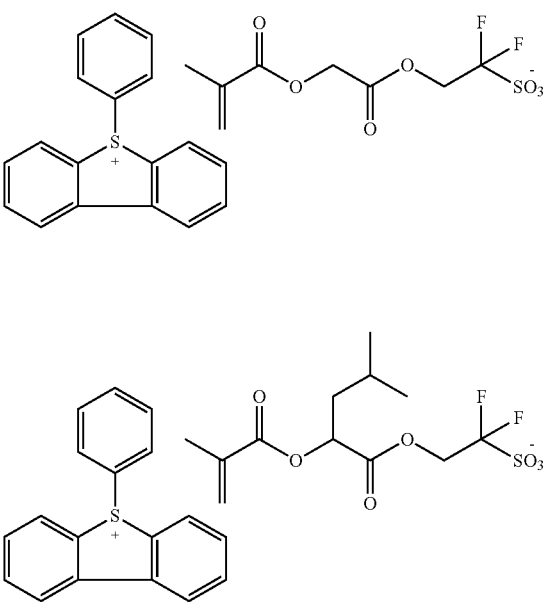

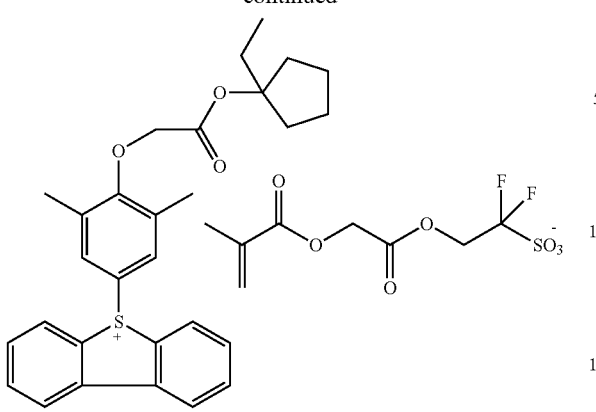
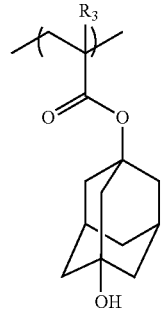

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Additional preferred resins for use in photoresists to be imaged at sub-200 nm, such as at 193 nm, comprises units of the following general formulae (I), (II) and (III):

Preferred resins for use in photoresists to be imaged at sub-200 nm, such as at 193 nm, comprise units of the following general formulae (I), (II) and (III):

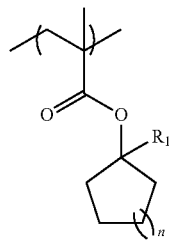

(I)

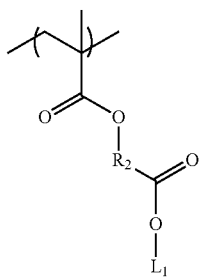

(II)

(III)

wherein: $R_1$ is a $(C_1-C_3)$alkyl group; $R_2$ is a $(C_1-C_3)$alkylene group; $L_1$ is a lactone group; and n is 1 or 2.

Polymers for use in photoresists of the invention may suitably vary widely in molecular weight and polydisperity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy) benzene, and 1,2,3-tris(p-toluenesulfonyloxy)benzene; diazomethane derivatives, for example, bis(benzenesulfonyl) diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis (2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

The following non-limiting examples are illustrative of the invention.

Examples 1-3: Thermal Acid Generator Syntheses

Example 1: Synthesis of 2-methylpyridin-1-ium 4-methylbenzenesulfonate

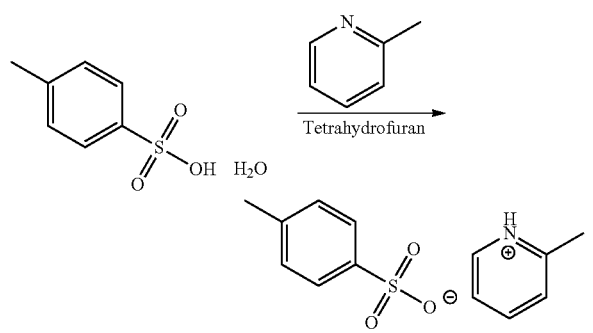

As generally depicted in the above scheme, 4-methylbenzenesulfonic acid hydrate (45.0 g, 1.0 eq) was dissolved in tetrahydrofuran (450 mL) and 2-methylpyridine (24.2 g, 1.1 eq) was added dropwise while vigorously stirring at 0° C. for 0.5 hour. After addition, the reaction mixture was stirred at R.T. for 16 hours. It was filtered and washed by using tetrahydrofuran (450 mL). The white solid was dried under vacuum and final yield was 85% of the title compound 2-methylpyridin-1-ium 4-methylbenzenesulfonate as shown in the scheme.

Example 2: Synthesis of 4-methoxypyridin-1-ium 4-methylbenzenesulfonate

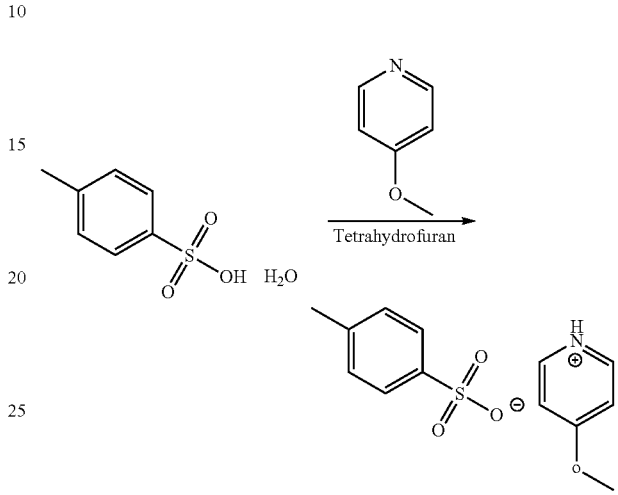

4-methylbenzenesulfonic acid hydrate (39.0 g, 1.0 eq) was dissolved in tetrahydrofuran (390 mL) and 4-methoxypyridine (29.6 g, 1.1 eq) was added dropwise while vigorously stirring at 0° C. for 0.5 hour. After addition, the reaction mixture was stirred at R.T. for 16 hours. It was filtered and washed by using tetrahydrofuran (390 mL). The white solid was dried under vacuum and final yield was 89% of the title compound 4-methoxypyridin-1-ium 4-methylbenzenesulfonate as shown in the scheme.

Example 3: Synthesis of 2,4,6-trimethylpyridin-1-ium 4-methylbenzenesulfonate

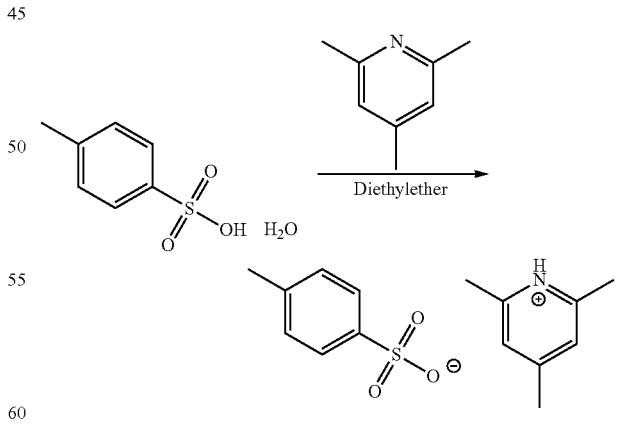

4-methylbenzenesulfonic acid hydrate (70.0 g, 1.0 eq) was dissolved in diethylether (1400 mL) and 2,4,6-trimethylpyridine (49. g 1.1 eq) was added dropwise while vigorously stirring at 0° C. for 0.5 hour. After addition, the reaction mixture was stirred at R.T. for 16 hours. It was filtered and washed by using diethylether (700 mL). The white solid was dried under vacuum and final yield was 93% of the title compound 2,4,6-trimethylpyridin-1-ium 4-methylbenzenesulfonate 2,4,6-trimethylpyridin-1-ium 4-methylbenzenesulfonate as shown in the above scheme.

Example 4: Solubility

Thermal acid generators of Examples 1 through 3 and a Reference of sulfonic acid ammonium salt derivative were evaluated for solubility in 2-hydroxyisobutyric acid methyl ester, propylene glycol methyl ether and ethyl lactate by the following protocol: 1) a super-saturated solution of the tested thermal acid generator in the specified solvent was prepared, 2) that super-saturated solution at room temperature was shaken for 16 hours 3) following shaking, the solution was filtered with 0.45 nm PTFE, and then 4) the solid content of the solution was measured by Thermal Gravimetric Analysis (10° C./min to 600° C.).

TABLE 1

| (Unit: wt. %) | Ref. | Example 1. | Example 2. | Example 3. |
|---|---|---|---|---|
| HBM | 0.2 | 20 | 18 | 22 |
| PGME | 0.8 | 27 | 26 | 33 |
| EL | 0.8 | 29 | 32 | 32 |

Example 5: Defectivity

A first coating composition was prepared that contained an polyester/isocyanuate polymer 83~84 weight percent based on total solids of the composition, glycoruril crosslinker 15 weight percent based on total solids of the composition, the thermal acid generator of Example 3 (2,4,6-trimethylpyridin-1-ium 4-methylbenzenesulfonate) TAG 1~2 weight percent of total solids of the composition.

A second coating composition was prepared that was identical to the above first coating composition expect reference sulfonic acid ammonium salt derivative was substituted for the thermal acid generator of Example 3.

The first and second coating compositions were spin coated onto semiconductor wafers and cured at 205° C./60 s.

Defects were then evaluated by the following protocol: measured with SP2 from KLA. p-pol. oblique incidence light, and full aperture light detection (narrow and wide angle without polarizer), 75 nm LSE minimum sensitivity.

The first coating composition showed the much less defect count (Defect count=13) than the second coating composition with reference thermal acid generator (the second coating composition had a Defect count=31).

Example 6: Lithography

The first coating composition prepared in Example 5 is spin-coated on 150-mm silicon wafers at 1500 rpm, and then baked at 205° C. for 60 seconds using a TEL Mark 8 wafer coating track machine. The BARC coating thickness after bake is suitably about 1200 Å. Dow UV™1610 DUV photoresist is spin-coated on top of BARC coating and baked at 100° C. for 60 seconds. The photoresist layer is next exposed through a target mask using a 248 nm KrF wafer stepper with 0.65 NA. The photoresist layer is next post-exposure baked at 120° C. for 60 seconds, and then developed using Dow MF™ CD-26 TMAH developer in a standard 60 second single puddle process.

What is claimed is:

1. A coated substrate comprising:
   a substrate having thereon:
   a) a composition comprising:
      1) a resin; and
      2) an ionic thermal acid generator that comprises:
         i) a pyridinium component having one or more ring substituents selected from optionally substituted alkyl and optionally substituted heteroalkyl; and
         ii) a sulfonic acid component;
   b) a layer of a photoresist composition above the a) composition.

2. The coated substrate of claim 1, wherein the a) composition does not contain a photoacid generator.

3. The coated substrate of claim 1, wherein the a) composition further comprises a crosslinker component.

4. The coated substrate of claim 1, wherein the resin comprises one or more cyanurate groups and polyester linkages.

5. The coated substrate of claim 1, wherein the thermal acid generator has a structure of the following Formula (I):

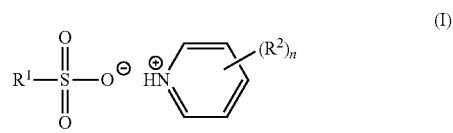

wherein $R^1$ is a non-hydrogen substituent;
each $R^2$ is independently a non-hydrogen substituent;
and n is 0, 1, 2, 3, 4 or 5.

6. The coated substrate of claim 1, wherein the sulfonic acid component is an optionally substituted aryl sulfonic acid.

7. The coated substrate of claim 1, wherein the ring nitrogen of the pyridinium component is not substituted.

8. The coated substrate of claim 1, wherein the composition further comprises a solvent component that comprises 2-hydroxyisobutyric acid methyl ester, propylene glycol methyl ether and/or ethyl lactate.

9. The coated substrate of claim 1, wherein the thermal acid generator comprises a pyridinium component of one of the following structures:

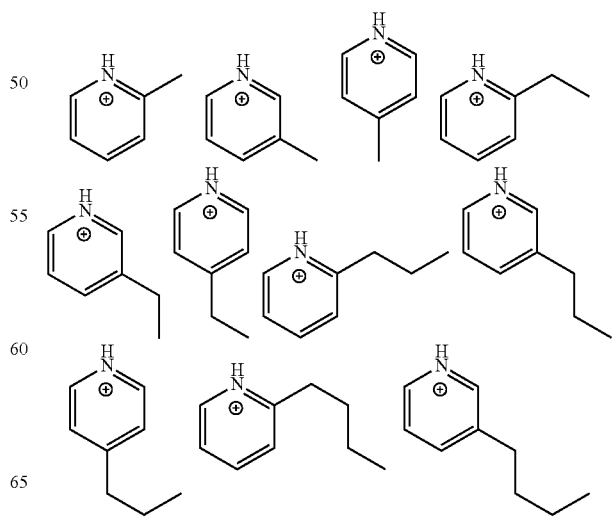

-continued
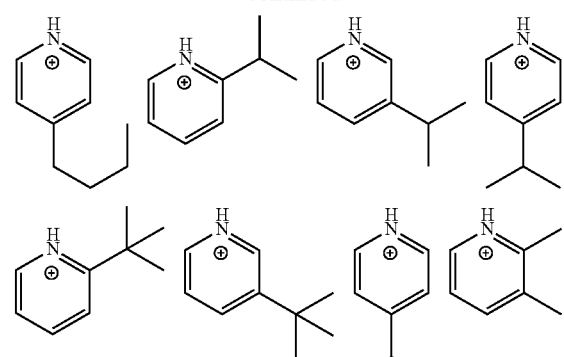
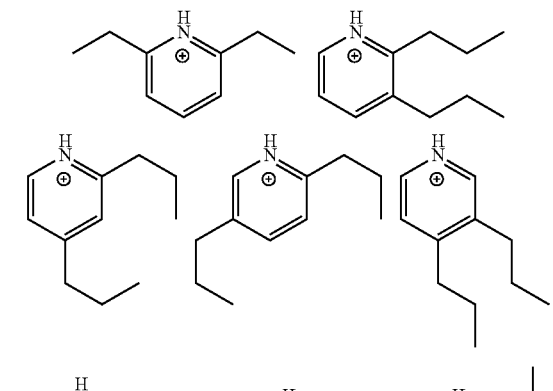
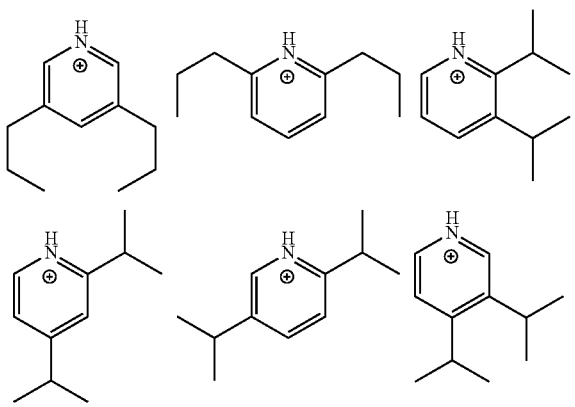
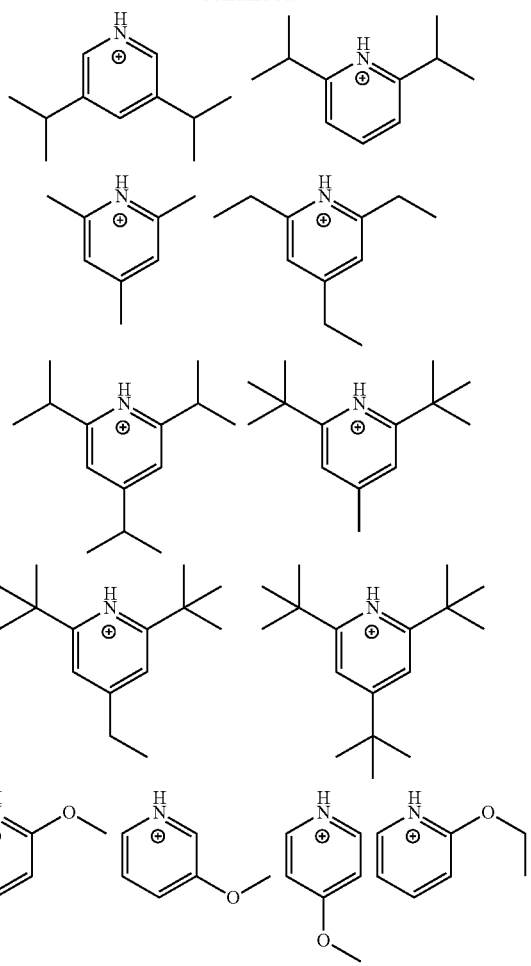
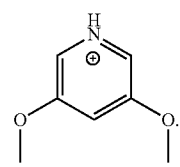

10. A method for forming photoresist relief image, the method comprising:
   a) providing the coated substrate of claim 1;
   b) imaging the layer of the photoresist composition with patterned activating radiation; and
   c) developing the imaged layer of the photoresist composition to provide a photoresist relief image.

11. The method of claim 10, wherein the a) composition does not contain a photoacid generator.

12. The method of claim 10, wherein the resin comprises one or more cyanurate groups and polyester linkages.

13. The method of claim 10, wherein the thermal acid generator has a structure of the following Formula (I):

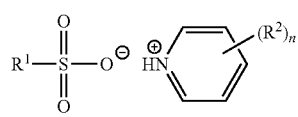

wherein $R^1$ is a non-hydrogen substituent;
each $R^2$ is independently a non-hydrogen substituent; and n is 0, 1, 2, 3, 4 or 5.

14. The method of claim 10, wherein the sulfonic acid component is an optionally substituted aryl sulfonic acid.

15. The method of claim 10, wherein the ring nitrogen of the pyridinium component is not substituted.

16. The method of claim 10, wherein the composition further comprises a solvent component that comprises 2-hydroxyisobutyric acid methyl ester, propylene glycol methyl ether and/or ethyl lactate.

17. The method of claim 10, wherein the thermal acid generator comprises a pyridinium component of one of the following structures:

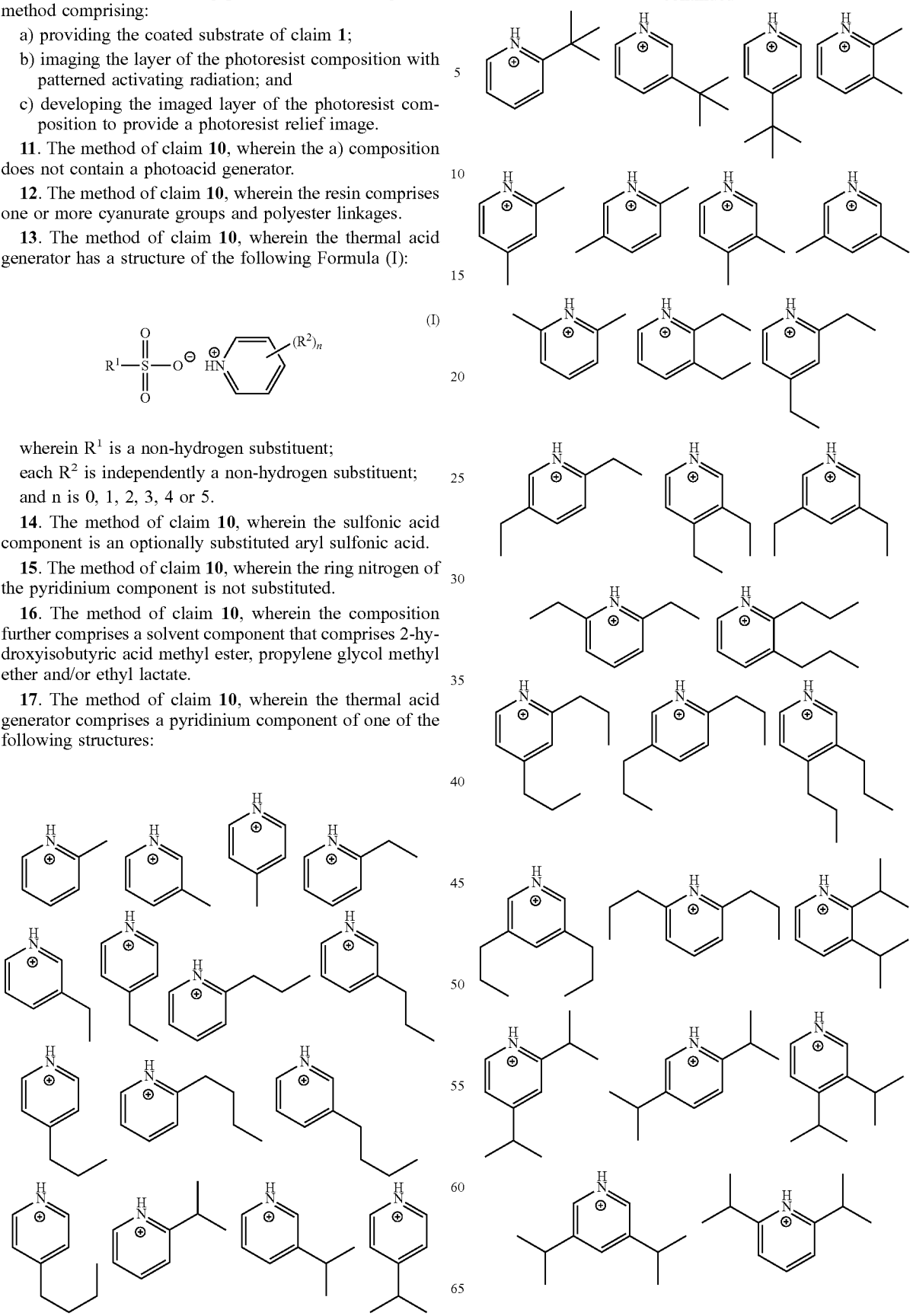

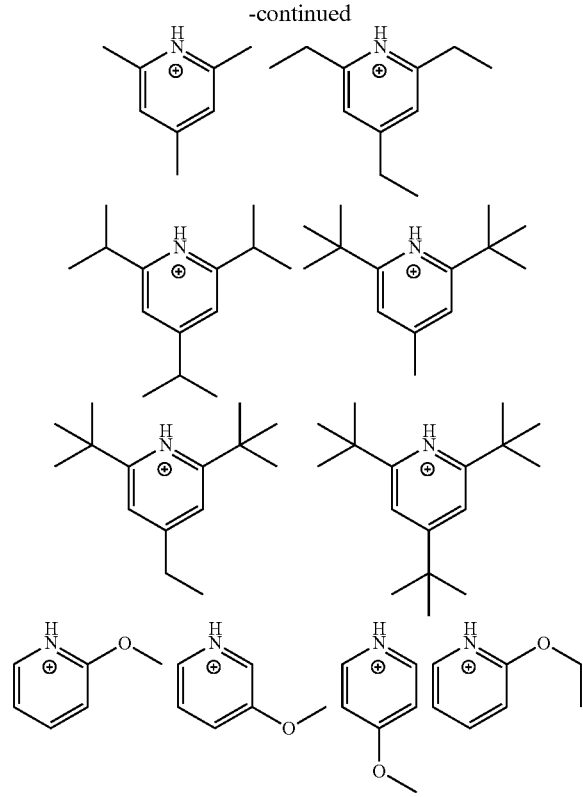
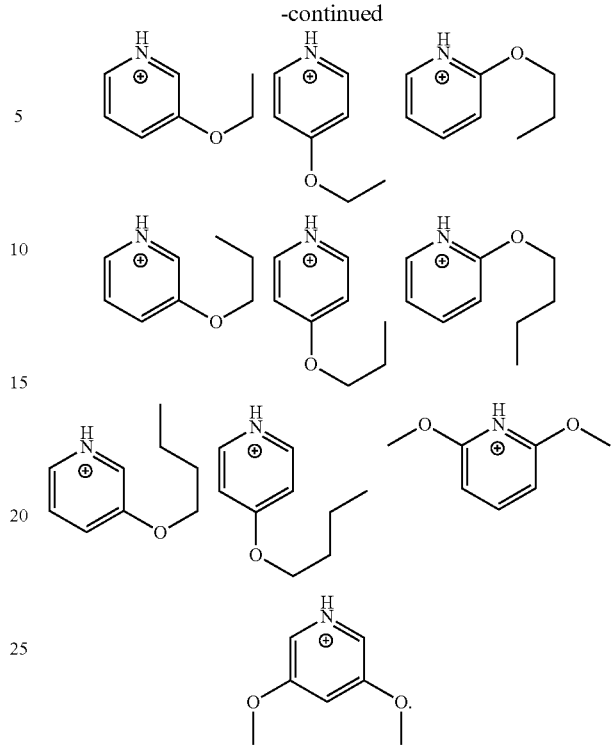
* * * * *